US006967604B2

(12) United States Patent
Maede et al.

(10) Patent No.: US 6,967,604 B2

(45) Date of Patent: Nov. 22, 2005

(54) D/A CONVERTER CIRCUIT, ORGANIC EL DRIVE CIRCUIT AND ORGANIC EL DISPLAY DEVICE

(75) Inventors: Jun Maede, Kyoto (JP); Shinichi Abe, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/994,293

(22) Filed: Nov. 23, 2004

(65) Prior Publication Data

US 2005/0110665 A1 May 26, 2005

(30) Foreign Application Priority Data

Nov. 26, 2003 (JP) ............................ 2003-395666

(51) Int. Cl.[7] ................................................ H03M 1/00

(52) U.S. Cl. ........................................ 341/135; 357/72

(58) Field of Search ........................ 341/108, 110, 143, 341/144, 145; 345/87, 89, 99, 212, 690, 204, 345/214, 197, 213; 245/87, 89, 99, 212, 690, 245/204, 214; 257/13, 59, 72, 69, 79, 99, 257/100

(56) References Cited

U.S. PATENT DOCUMENTS 4,513,278 A * 4/1985 Seitz et al. ................. 341/138
6,157,334 A * 12/2000 Kimura ...................... 341/153
6,169,509 B1 * 1/2001 Abe ........................... 341/150
6,781,532 B2 * 8/2004 Wei ........................... 341/122
6,844,839 B2 * 1/2005 Lee et al. ................... 341/144
6,894,312 B2 * 5/2005 Yamazaki et al. ............ 257/72
6,894,436 B2 * 5/2005 Togashi et al. .......... 315/169.4
6,897,087 B2 * 5/2005 Yanagawa et al. ............ 438/99

FOREIGN PATENT DOCUMENTS

JP 2003-234655 8/2003
JP 2003-308043 10/2003

* cited by examiner

*Primary Examiner*—Brian Young
(74) *Attorney, Agent, or Firm*—Mattingly, Stanger, Malur & Brundidge, P.C.

(57) ABSTRACT

In a D/A converter circuit including a current mirror circuit constructed with an input side transistor circuit and an output side transistor circuit, the input side transistor circuit comprises a series circuit of a first MOS transistor and a second MOS transistor and a first switch circuit connected in parallel to the first MOS transistor. Gates of the first and second MOS transistors are connected commonly and a source of either one of the first and second MOS transistors is connected to a drain of the other of the first and second MOS transistors and the second MOS transistor has a gate length shorter than a gate length of the first MOS transistor.

15 Claims, 4 Drawing Sheets

D/A CONVERTER CIRCUIT, ORGANIC EL DRIVE CIRCUIT AND ORGANIC EL DISPLAY DEVICE

BACKGROUND OF THE INVENTION

1. Field of the Invention

The present invention relates to a D/A converter circuit, an organic electroluminescent (EL) drive circuit and an organic EL display device which is a self-emissive type display that uses organic materials formed into thin films and that is driven by electric current to generate light. Particularly, the present invention relates to an improvement of a D/A converter circuit constructed with a current mirror circuit capable of obtaining a large analog current even when a power source voltage is low. Further, the present invention relates to an improvement of an organic EL drive circuit having a D/A converter circuit constructed with a current mirror circuit for generating a drive current according to display data and supplying the drive current to a terminal pin of a column line (anode side drive line of an organic EL element) of an organic EL panel so that the D/A converter circuit of the organic EL element drive circuit can generate a drive current having a peak current for initially charging the organic EL element while driving the D/A converter circuit with low voltage, without increasing an area of each of drive circuits provided correspondingly to terminal pins of the organic EL display panel.

2. Description of the Related Art

An organic EL display panel of an organic EL display device for use in a portable telephone set, a PHS, a DVD player, PDA (portable digital assistances), etc., including 396 (132×3) terminal pins for column lines and 162 terminal pins for row lines has been proposed. The number of the terminal pins for column lines and row lines is still increasing.

JP2003-234655A assigned to the assignee of this application discloses an organic EL element drive circuit provided for each column pin of an organic EL display panel, in which, in response to a reference drive current and display data corresponding to the column pin, which is supplied to a D/A converter circuit provided correspondingly to the column pin, a drive current for each of the terminal pins arranged in a column direction or a current on a basis of which the drive current is derived is generated by D/A converting the display data according to the reference drive current.

In order to reduce power consumption, the power source voltage of the D/A converter is restricted to about DC 3V and only the power source voltage of a final output stage current source is set to, for example, DC 15V to DC 20V. The D/A converter responds to the reference drive current to generate the current on which the drive current of the organic EL element is generated and which drives the output stage current source. In this manner, power consumption of the whole drive circuit is restricted. In such case, the drive current for driving the organic EL element, which is supplied to the terminal pin connected to the organic EL element, has a peak portion in an initial drive stage in order to initially charge the organic EL element, which is a capacitive load.

Generation of the peak portion of the drive current is performed by either a circuit portion of an organic EL drive circuit, which is preceding the D/A converter circuit, or a circuit portion of the organic EL drive circuit, which is subsequent to the D/A converter circuit. In JP2003-234655A, such peak current generator circuit is provided between the D/A converter circuit and an output stage current source.

The peak current generator circuits are provided correspondingly to the respective column pins and each requires a large current. When such peak current generator circuit for each column pin is provided between a D/A converter circuit and an output stage current source and the number of column pins is increased, the circuit size of the current drive circuit is increased correspondingly. In order to solve this problem, U.S. patent application Ser. No. 10/360,715 (corresponding to JP2003-308043A) assigned to the assignee of this application discloses a technique in which a peak current generator circuit is added to a D/A converter circuit, which is constructed with a current mirror circuit.

When the peak current generator circuit constructed with the D/A converter circuit is added to the current mirror circuit, it is necessary to increase an output analog current of the D/A converter circuit up to a current value, which is large enough to obtain the peak current. When the D/A converter circuit includes a current mirror circuit constituted with MOS transistors in order to reduce power consumption, it is impossible to obtain large enough analog current in the output side transistor of the current mirror circuit unless a large amount of drive current is supplied to the input side transistor by making the gate-source voltage VGS of the input side transistor of the current mirror circuit larger. However, when the power source voltage of the D/A converter circuit is about DC 3V or lower, the gate-source voltage VGS of the input side transistor is limited by the power source voltage as low as about DC 3V or less and it becomes impossible to generate the large enough peak current. As a result, it becomes difficult to obtain the peak current, which is about 10 times a steady state drive current.

In order to solve such problems, it may be considered to shift a level of the drive voltage of the input side transistor of the current mirror circuit by means of a level shift circuit. In such case, however, the circuit size may be increased as in the case where the peak current generator circuit is provided independently.

On the other hand, when the digital display data is converted into analog signal according to the reference drive current by the current mirror circuit, variation of conversion characteristics of D/A converter circuits corresponding to the respective terminal pins causes the output currents of the column pins to be varied, resulting in luminous unevenness and luminous variation on a display screen of the organic EL display panel.

The luminous unevenness and luminous variation can not be absorbed completely by mere regulation of values of the reference drive currents supplied to the D/A converter circuits. Therefore, a regulator circuit for regulating the analog current obtained by the D/A converter circuit has to be added to the D/A converter circuit. However, since such regulation circuit has to be provided for each of the column pins, the size of the whole circuit becomes large when the number of circuit elements of the regulator circuit is increased, resulting in that it becomes difficult to fabricate the current drive circuit as one IC chip.

In order to solve such problems, U.S. patent application Ser. No. 10/948,237 assigned to the assignee of this application discloses a technique in which a D/A converter circuit is constructed with transistors having large channel lengths to reduce variation of output voltages of the output side transistors of the D/A converter circuits. However, when such transistors having large channel lengths are used, the voltage VGS of the input side transistor of the current mirror circuit must be made large. Therefore, the use of transistors having large channel lengths in the D/A converter circuit has a defect that the power source voltage can not be reduced sufficiently.

SUMMARY OF THE INVENTION

An object of the present invention is to provide a D/A converter circuit utilizing a current mirror circuit, which can obtain a large analog current even when a power source voltage is low.

Another object of the present invention is to provide an organic EL element drive circuit capable of generating, in a drive current for driving an organic EL element, a peak current for initially charging the organic EL element by a D/A converter circuit driven by low voltage, without increasing an area occupied by a drive circuit for each of terminal pin of an organic EL display panel.

A further object of the present invention is to provide an organic EL display device capable of reducing luminous variation on an organic EL display panel.

In order to achieve the above mentioned objects, a D/A converter circuit, an organic EL drive circuit and an organic EL display device according to the present invention, each including a current mirror circuit constituted with an input side transistor circuit and an output side transistor circuit, are featured by that the input side transistor circuit comprises a series circuit of a first MOS transistor and a second MOS transistor and a first switch circuit connected in parallel to the first MOS transistor, that gates of the first and second MOS transistors are connected commonly, that a source of either one of the first MOS transistor and second MOS transistor is connected to a drain of the other of the first and second MOS transistors, that the second MOS transistor has a gate length shorter than a gate length of the first MOS transistor, that either one of a non-connected source and a non-connected drain of the first and second MOS transistors is connected to a power source line of a predetermined voltage, directly or through other element or a circuit, and that the first switch circuit being turned ON to supply a current larger than a current determined by a source-gate voltage between the gate and the non-connected source of one of the first and second MOS transistors, which is limited by said predetermined voltage, to the series circuit to thereby obtain a large analog current at the output side transistor circuit of the current mirror circuit.

In the present invention, since the gate length of the second MOS transistor is smaller than that of the first MOS transistor, the first MOS transistor is short-circuited and only the second MOS transistor works in the series circuit when the first switch circuit is turned ON.

As represented by the equation (2) to be described later, the gate-source voltage VGS of a MOS transistor is a function of product of gate length (channel length L) and drain current ID. Therefore, when the gate length (channel length L) is made one half or smaller with the gate-source voltage being constant, a drain current ID becomes about twice as much.

On the other hand, the peak drive current required to initially charge the organic EL element is usually at least twice as much a steady drive current. In order to obtain such high peak drive current, the series circuit of the first MOS transistor and the second MOS transistor having gate length smaller than that of the first MOS transistor is provided and the first MOS transistor is short-circuited when the first switch circuit is turned ON. In this manner, the input side transistor circuit of the current mirror circuit is driven by the drive current, which is at least twice as much the steady drive current. Therefore, it is possible to obtain the analog current at least twice the steady analog current at the output side transistor circuit of the current mirror circuit with the value of the display data to be analog-converted being constant.

Incidentally, since the gate length (channel length) L influences the preciseness of digital-analog conversion as will be clear from the equation (1) to be described later, a large gate length L of a transistor is preferable for a steady driving of the organic EL element as will be clear from the equation (2).

As such, when a drive current as large as the peak drive current is to be generated between a source and a drain of the input side transistor of the current mirror circuit with the gate-source voltage VGS of the input side transistor, which is limited by the power source line voltage, such large analog current can be obtained, even if the gate-source voltage is lower than the voltage (the predetermined voltage) limited by the power source voltage, by turning the first switch circuit ON.

Therefore, even if the power source voltage of the D/A converter circuit is low, it is possible to make the gate-source voltage low and to generate the large analog current, which can be used as the peak drive current, in the output side transistor circuit of the current mirror circuit.

Incidentally, since a total area of the transistors constituting the switch circuits can be made considerably smaller than a total area of the transistors for outputting currents, a total area of the organic EL drive circuit is not increased even when such switch circuits are added thereto.

As a result, according to the present invention, it is possible to realize the D/A converter circuit, which utilizes the current mirror circuit and is capable of obtaining large analog current even when the power source voltage is low. Further, according to the present invention, it is possible to generate the peak drive current for initially charging the organic EL element as the analog output current of the D/A converter circuit driven with low voltage without increasing the total area occupied by the drive circuits provided correspondingly to the terminal pins.

BRIEF DESCRIPTION OF THE DRAWINGS

FIG. 3(*b*) is a cross sectional view taken along a line A—A in FIG. 3(*a*);

FIG. 4(*b*) is a cross sectional view taken along a line A—A in FIG. 4(*a*).

DETAILED DESCRIPTION OF THE PREFERRED EMBODIMENTS

Figure 1:
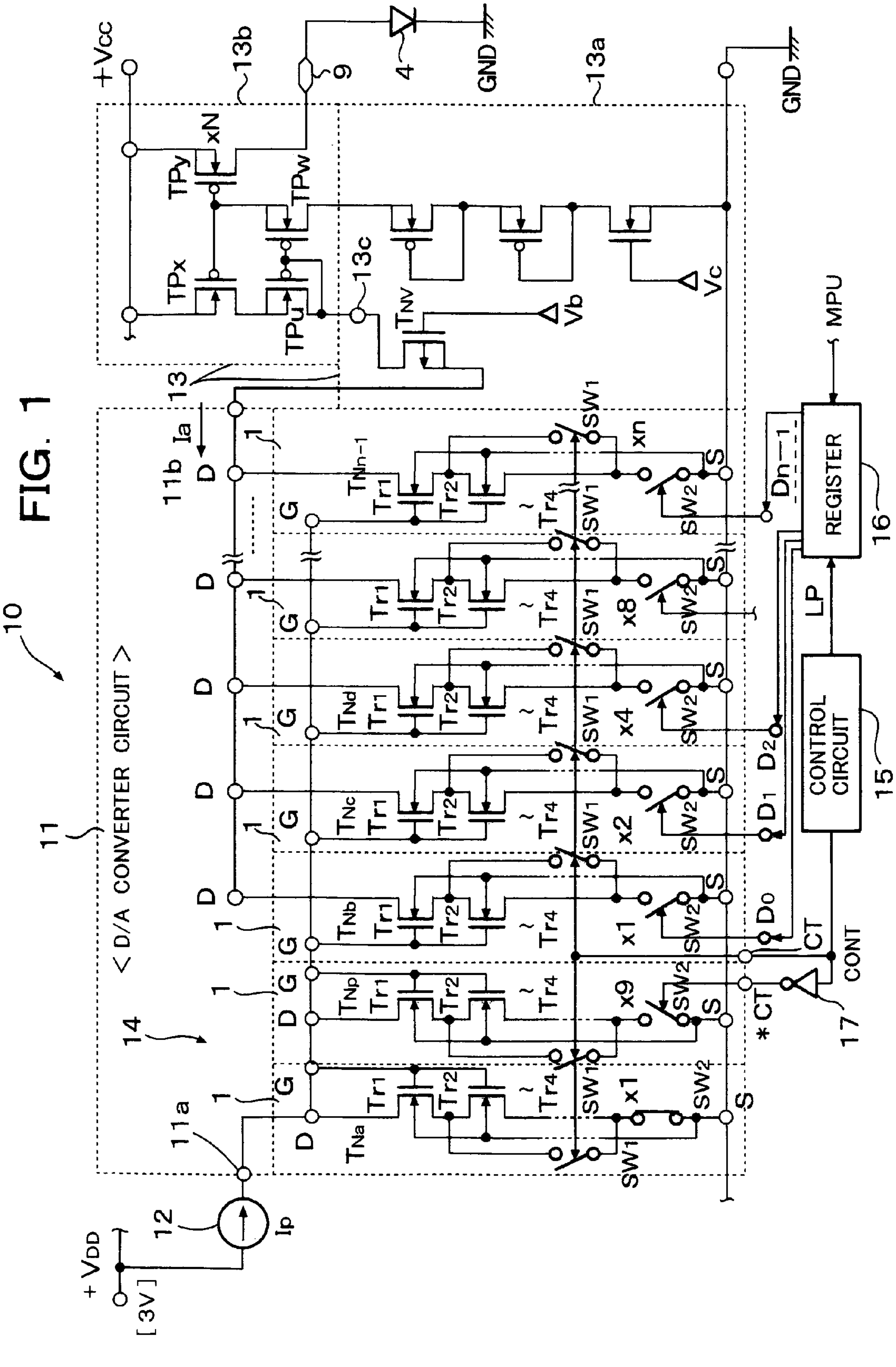
FIG. 1 is a block circuit diagram of an organic EL element drive circuit including a D/A converter circuit according to an embodiment of the present invention.

Variation ΔI of an output side current of a current mirror circuit using MOS transistors with respect to a predetermined input side drive current Ip (corresponding to a reference drive current Ip) thereof can be represented by the following equation (1):

$$\Delta I = Ip - 2\Delta Vth/(VGS - Vth) \tag{1}$$

where VGS is gate-source voltage of a MOS transistor, Vth is threshold voltage of the MOS transistor, ΔVth is a difference between a threshold voltage, which is a designed reference voltage of the MOS transistor, and the threshold voltage Vth.

The difference (VGS−Vth) between the gate-source voltage and the threshold voltage Vth in the equation (1) can be represented by the following equation (2):

$$VGS-Vth=\sqrt{\{(2/\mu nCox)\cdot(L/W)\cdot ID\}} \quad (2)$$

where $\mu$n is electron mobility, Cox is capacitance of unit area of a gate oxide film of the MOS transistor, ID is drain current, L is channel length corresponding to gate length and W is channel width.

Assuming that drain current ID is constant, variation ΔI can be reduced by making (VGS−Vth) larger. In order to increase (VGS−Vth), it is necessary to increase L/W. In other words, it is necessary to reduce W/L, a reciprocal of L/W.

Therefore, it is necessary to use the transistor having large channel length. When channel length of the transistor is increased, the gate-source voltage VGS of the transistor is increased correspondingly.

On the other hand, according to the requirement of higher definition of display, the number of drive pins of the organic EL panel tends to be increased. Since power consumption of the organic EL display device is increased with increase of the number of terminal pins, further reduction of power consumption is necessary. In order to achieve reduction of the power consumption of the organic EL drive circuit, it is necessary to restrict the operating power source voltage of a D/A converter circuit to about 3V or lower. Therefore, it is impossible to increase the gate-source voltage VGS of the transistor of the D/A converter circuit.

Comparing a transistor having channel length L with a transistor having channel length L/2 with the gate-source voltages VGS being constant, a drain current ID of the latter transistor having channel length L/2 can become twice the former transistor according to the equation (2).

In view of this, according to the present invention, two MOS transistors are connected in series during a steady current drive period. The series circuit is used as it is to increase the channel length of the series circuit at least twice that during the peak current drive period to thereby restrict variation of analog outputs of the D/A converter circuits and improve the preciseness of D/A conversion. In the peak current drive period, the channel length of the series connected MOS transistors is shortened by short-circuiting one of the series connected MOS transistors to supply a drive current, which is twice or more of the steady drive current, to the input side transistor of the current mirror circuit, to thereby generate large output analog current in the output side transistor of the current mirror circuit as the peak drive current of the organic EL element.

Incidentally, even if the precision of the output analog current of the D/A converter circuit is lowered more or less for some period due to the shortened channel length during the peak current drive, the period is short since a substantial portion of the peak drive current is used to initially charge the organic EL element, so that there is almost no influence thereof on luminance of the organic EL element.

(Embodiment 1)

In FIG. 1, a circuit diagram of a column driver 10 of an organic EL drive circuit includes a D/A converter circuit 11 constructed with a current mirror circuit, a constant current source 12 for generating a reference drive current Ip, a current output circuit 13 of the current mirror circuit, a peak current generator circuit 14, a control circuit 15 and a register 16 for storing display data.

The current mirror circuit constituting the D/A converter circuit 11 includes two input side transistor cells TNa and TNp and a number of output side transistor cells TNb~TNn−1. The input side transistor cell TNp is provided in parallel to the input transistor cell TNa.

Figure 2:
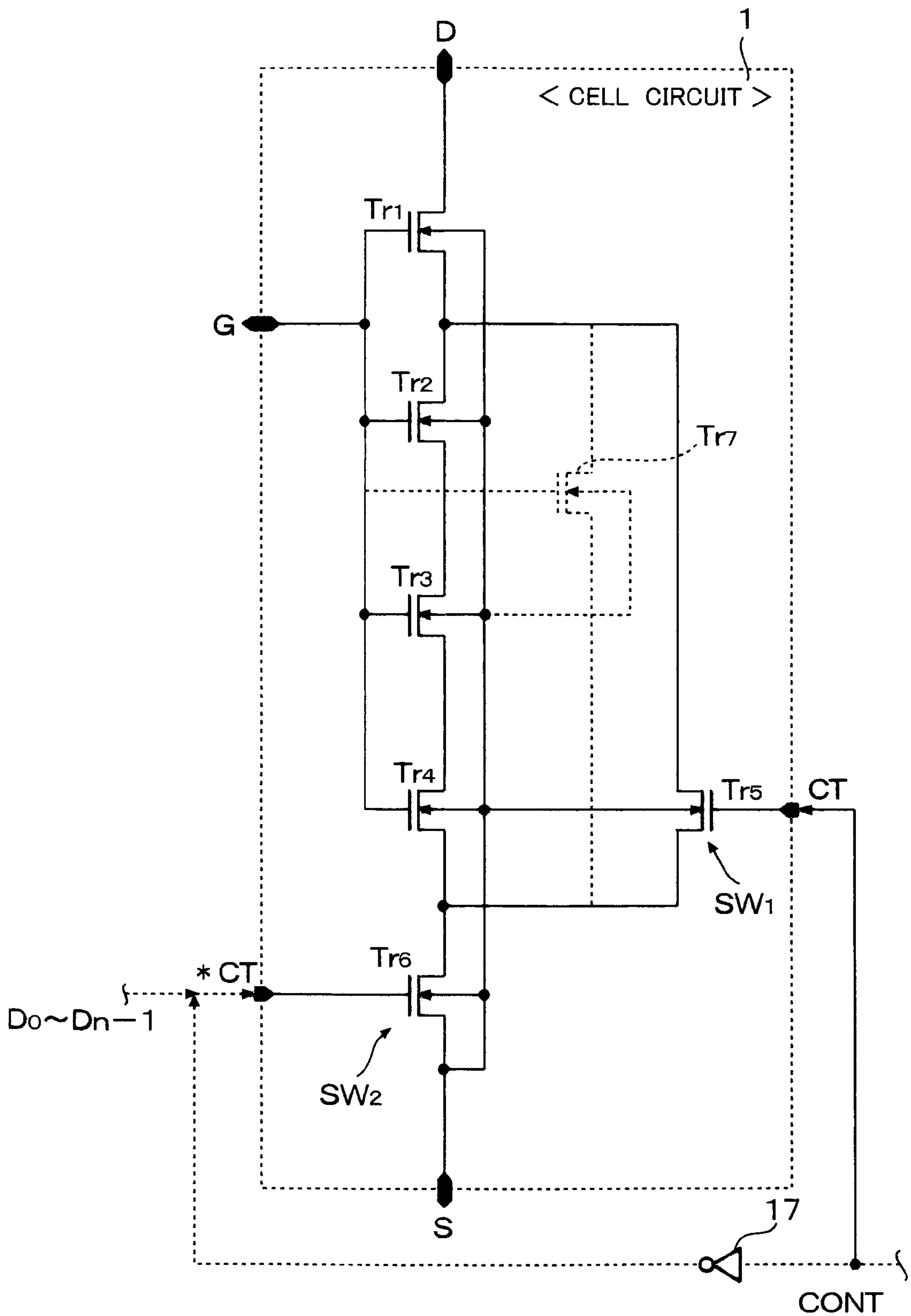
FIG. 2 is a circuit diagram of a transistor cell circuit in a current mirror type D/A converter circuit.

Each of the transistor cells TNa~TNn−1 and TNp is constructed with a unit cell circuit 1 having a drain terminal D, a source terminal S and terminals CT and *CT, as shown in FIG. 2. The source terminal S of the unit cell circuit 1 is grounded. The terminals CT of the unit cell circuits 1 are connected together and derived outside of the D/A converter circuit 11 as an input terminal of the D/A converter circuit 11.

The gate terminals G of the unit cell circuits 1 are connected commonly. The gate terminals G and the drain terminals D of the transistor cells TNa and TNp are connected to an input terminal 11*a* of the D/A converter circuit 11 to form diode connections by the input side transistors of the current mirror circuit.

In FIG. 2, the terminal *CT of the cell circuit 1 constituting the transistor cell TNa is connected to a predetermined bias line so that a switch circuit SW2 is normally ON. The switch circuit SW2 is provided for balancing the D/A converter circuit.

The terminal *CT of the unit cell circuit 1 of the transistor cell TNp is derived outside of the D/A converter circuit 11 and is supplied with a control pulse CONT through an inverter 17. The terminals *CT of the transistor cells TNb~TNp are display data terminals D1~Dn−1, respectively. Namely, the states of the switch circuits SW2 of the transistor cells TNb~TNn−1 are determined according to the display data. The display data are set in the register 16 from a MPU, etc., according to a latch pulse LP of the control circuit 15. Incidentally, a peak current generating period in the steady drive current of the organic EL element is determined by the control pulse CONT. That is, in a period in which a level of the control pulse CONT is high (H), the peak drive current is generated in the steady drive current.

In FIG. 1, numerical expressions ×1, ×2, ×4, . . . indicate the number of unit cell circuits 1 to be connected in parallel. Outputs of the output side transistor cells TNb~TNn−1 are weighted as shown by the numerical expressions, respectively.

The number of the unit cell circuits 1 connected in parallel to form the transistor cell TNa to the number of the unit cell circuits 1 connected in parallel to form of the transistor cell TNp is 1:9. Therefore, a ratio of the channel widths (gate widths) of these transistor cells is set to 1:9.

The constant current source 12 is connected to a power source line +VDD of as low as, for example, +3V and supplies the reference drive current Ip to the transistor cells TNa and TNp through the input terminal 11*a* of the D/A converter circuit 11.

The constant current source 12 corresponds to an output current source of a reference current distributor circuit. The reference current distributor circuit distributes a reference current Ip supplied to an input side transistor of a current mirror circuit constituting an A/D converter circuit to a number of output side transistors of the current mirror circuit, which are provided in parallel correspondingly to terminal pins, as mirror currents. In this embodiment, the reference current Ip is inputted to the transistor cell TNa of the each of the D/A converter circuit 11 and a drive current Ia (=Ipa) for generating the peak drive current according to the reference current Ip and display data D0~Dn−1 is outputted to the terminal 11*b* as a total analog current of the output side transistors. Incidentally, the current source 12 is one of the output side transistors of the current mirror circuit constituting the reference current distributor circuit and usually a P channel MOS transistor having a source connected to the power source line +VDD and a drain connected to the input terminal 11*a*.

The current mirror output circuit 13 is constructed with a drive level shifter circuit 13*a* and an output stage current mirror circuit 13*b*.

The drive level shifter circuit 13*a* includes an N channel MOS FET TNV and functions to transmit the output of the D/A converter circuit 11 to the output stage current mirror circuit 13*b*. A gate of the MOS FET TNV is connected to a bias line Vb and a source thereof is connected to the output terminal 11*b* of the D/A converter circuit 11. A drain of the MOS FET TNv is connected to an input terminal 13*c* of the output stage current mirror circuit 13*b*.

Thus, it is possible to input the drive current Ia, which is the analog output current of the D/A converter circuit 11, to the input terminal 13*c* of the output stage current mirror circuit 13*b*.

Incidentally, the drive level shifter circuit 13*a* includes three series connected MOS transistors provided between a drain of a transistor TPW of the output stage current mirror circuit 13*b* and ground GND. The three MOS transistors constitute a bias circuit for the transistor TPW. A bias line Vc biases an N channel MOS transistor, which is one of the three series-connected MOS transistors. The N channel MOS transistor is used as a bias resistor.

The output stage current mirror circuit 13*b* includes P channel MOS FETs TPu and TPW constituting a current mirror circuit for correcting base current and P channel MOS FETs TPX and TPy constituting the output stage current mirror circuit.

Channel width ratio of the transistors TPX and TPy of the output stage current mirror circuit 13*b* is 1:N (where N>1) and sources of these transistors are connected to a power source line +Vcc whose voltage is higher than that of the power source line +VDD, for example, +15V. An output of the output side transistor TPy is connected to a column side pin 9 and, in a drive period, the output side transistor TPy current-drives an organic EL element 4 by supplying drive current N×Ia thereto. Incidentally, the organic EL element 4 is connected between the terminal pin 9 and ground GND and the terminal pin 9 functions as the column pin of the organic EL element 4 as well as an output terminal of the output stage current mirror circuit 13*b*.

As shown in FIG. 2, the cell circuit 1 constituting each of the transistor cells TNa~TNn−1 and TNp of the D/A converter circuit 11 is composed of a series circuit including four N channel MOS transistors Tr1~Tr4 having sources and drains connected sequentially respectively and two N channel MOS switching transistors Tr5 and Tr6, which constitute switch circuits SW1 and SW2, respectively.

The transistor Tr5 (the switch circuit SW1) is provided in parallel to the transistors Tr1~Tr4 and the transistor Tr6 (the switch circuit SW2) is provided in series with the transistors Tr1~Tr4. Gates of the transistors Tr1~Tr4 are commonly connected to the gate terminal G, a drain of the transistor Tr1 is connected to the drain terminal D and a source of the transistor Tr4 is connected to the source terminal S through the transistor Tr6 (the switch circuit SW2).

The transistor Tr5 (the switch circuit SW1) has a drain connected to the source of the transistor Tr4, a source connected to the source of the transistor Tr4 and a gate connected to the terminal CT. Thus, the transistor Tr5 (the switch circuit SW1) constitutes a short circuit for short-circuiting the transistors Tr1~Tr4.

The transistor Tr6 (the switch circuit SW2) has a drain connected to the source of the transistor Tr4, a source connected to the source terminal S and a gate connected to the terminal *CT.

As shown by dotted lines in a lower portion of FIG. 2, an inversion signal (*CONT), which is obtained by inverting the control pulse CONT for generating the peak current by the inverter circuit 17 (FIG. 1), is supplied from the control circuit 15 to the terminal *CT of the cell circuit 1 of the transistor cell TNp. On the other hand, the display data D0~Dn−1 are inputted to the terminals *CT of the transistor cells TNb~TNn−1, respectively. Therefore, the ON/OFF state of the transistor Tr6 is determined according to the display data D0~Dn−1, regardless of the control pulse CONT.

The terminal *CT of the cell circuit 1 of the transistor TNp becomes "H" level during a period for which the control pulse CONT is in "L" level, that is, the peak current is not generated, so that the transistor Tr6 is turned ON. Therefore, the reference current Ip from the constant current source 12 is branched to the transistors TNa and TNp and the drive current of the input side transistor of the current mirror circuit becomes Ip/10. Thus, it is possible to obtain the analog currents in the steady drive period.

The control pulse CONT is supplied to the terminal CT. When the control pulse CONT is in "H" (significant level), the transistors Tr5 of the cell circuits 1 of the transistors cells TNp and TNa~TNn−1 are turned ON and the transistor Tr6 of the cell circuits 1 of the transistors cells TNp is turned OFF. Therefore, during the period for which the peak drive current is generated, the transistors Tr2~Tr4 of each cell circuit 1 are short-circuited and only the transistor Tr1 can operate.

Incidentally, back gates of the transistors Tr1~Tr6 are commonly connected to the source terminal S.

Assuming that channel lengths of the transistors Tr1~Tr4 are constant, channel length of the series circuit of the transistors Tr2~Tr4 becomes three times that of the transistor Tr1. The transistors Tr5 and Tr6 are switching transistors having small channel lengths and small channel widths and perform the ON/OFF operation in non-saturation region. Therefore, it is possible to generate relatively large drain currents ID in the transistors Tr5 and Tr6 even if the gate-source voltages VGS of the transistors Tr5 and Tr6 are low. For example, the ON/OFF operation of the transistors Tr5 and Tr6 is possible even when the power source voltage is low.

On the other hand, in order to restrict the variation of analog current from the D/A converter circuits and improve the preciseness of D/A conversion, it is preferable that the total channel length of the series circuit of the transistors Tr1~Tr4 is large. When the channel length L is made large, it is impossible to obtain large drain current ID of these transistors unless the gate-source voltage VGS is high. However, when the power source voltage of the input side transistor of the D/A converter circuit 11 is about 3V or lower, the gate-source voltage VGS is restricted thereby and it becomes impossible to obtain a drain current ID as large as the peak current for initially charging the organic EL element.

In this embodiment, however, the switch circuits SW1 of the cell circuits 1 of the transistor cells TNp and TNa~TNn−1 are turned ON by the control pulse CONT as shown in FIG. 1, so that the operations of the transistors Tr2~Tr4 are stopped and only the transistor Tr1 can operate.

That is, when the switch circuit SW2 of the cell circuit 1 of the transistor cell TNp is turned OFF according to a *CONT signal obtained by inverting the control pulse CONT, the drain current ID as large as the peak drive current is obtained. The ON/OFF operation of the switch circuit SW2 of the cell circuit 1 of the transistor cell TNp is reversed with respect to the operation of the switch circuit SW1 of the same cell circuit 1. On the other hand, the switch circuits SW2 of the cell circuits 1 of the transistor cells TNb~TNn−1 are ON/OFF controlled according to logical values "H" (high level) and "L" (low level) of the display data D0~Dn−1. Since the control pulse CONT for the peak drive current becomes "H" for a constant time period in an initial portion of the drive period of the organic EL element 4, the transistor Tr5, that is, the switch circuit SW1, of the cell circuit 1 is turned ON, so that only the transistor Tr1 operates.

Consequently, the reference drive current Ip from the constant current source 12 flows to the transistor Tr1 of the transistor cell TNa and, in the output side transistor cells TNb~TNn−1, the analog current Ia (=Ipa) for generating the peak drive current for initially charging the organic EL element 4 is generated in the initial portion of the drive current of the organic EL element 4. In such case, the reference drive current Ip does not flow to the transistor Tr1 of the transistor cell TNp by turning the switch circuit SW2 of the transistor cell TNp OFF.

In this case, the gate-source voltages VGS of the transistor cell TNa and TNp of the D/A converter circuit 11 may be lower than that of the transistor cell TNa and TNp which are limited by the power source voltage +VDD.

Therefore, the channel length L is determined by that of the transistor Tr1, which is short. Thus, it is possible to supply the drain current ID large enough to generate the peak drive current to the transistor Tr1 without increasing the gate-source voltage VGS, that is, even when the power source voltage is about 3V or lower.

Assuming that channel lengths of the transistors Tr1~Tr4 are the same, channel length of the cell circuit 1 of the transistor cell TNa becomes one fourth since only the transistor Tr1 operates. Therefore, it is possible to supply the drain current ID, which is four times the steady drive current, to the transistor Tr1 of the transistor cell TNa without increasing the gate-source voltage VGS. Thus, it is possible to generate the analog current Ia (=Ipa) for the output side transistors cells TNb~TNn−1 by the reference drive current Ip even if the power source voltage +VDD is low.

Thereafter, the control pulse CONT from the control circuit 15 becomes "L" with a timing when the steady drive is started with steady drive current. Therefore, the *CONT signal becomes "H" and the switch circuit SW2 of the transistor cell TNp is turned ON, so that the reference drive current Ip flows to the transistor Tr1 of the cell circuit 1 of the transistor cell TNp. At this time, since the control pulse CONT is stopped, the switch circuits SW1 of the transistor cells TNp and TNa~TNn−1 become OFF state. Since the ratio of the number of cell circuits 1 of the input side transistor cell TNa and the number of cell circuits 1 of the input side transistor cell TNp is 1:9, the drive current of the input side transistor cells TNa and TNp becomes Ip/10 by the branching of the reference drive current Ip. Therefore, the drive current of the organic EL element 4 is reduced from the peak drive current to the steady drive current. In this case, since the channel length L is four times that when the analog peak current Ia (=Ipa) is generated, the variation of D/A converter circuits is reduced. Further, since the current flowing through each of the transistor cells TNa and TNp is Ip/10, it is unnecessary to reduce the gate-source voltage VGS.

Therefore, in response to the control pulse CONT and the inverted control pulse *CONT, the D/A converter circuit 11 can generate the peak drive current Ia (=Ipa) at the output terminal 11*b* thereof in the initial portion of the display period according to the display data by supplying the reference drive current Ip to the input side transistor cell TNa even when the power source voltage of the input side transistors of the D/A converter circuit 11 is as low as about 3V or even lower than about 3V. When the control pulse CONT is stopped, the reference drive current Ip is branched to the input side transistor cells TNa and TNp, so that the input side drive current of the current mirror circuit becomes substantially one tenth and it is possible to generate the analog current Ia (=Ipa/10) can be generated at the output terminal 11*b* of the D/A converter circuit 11 with high precision.

(Embodiment 2)

Figure 3A:
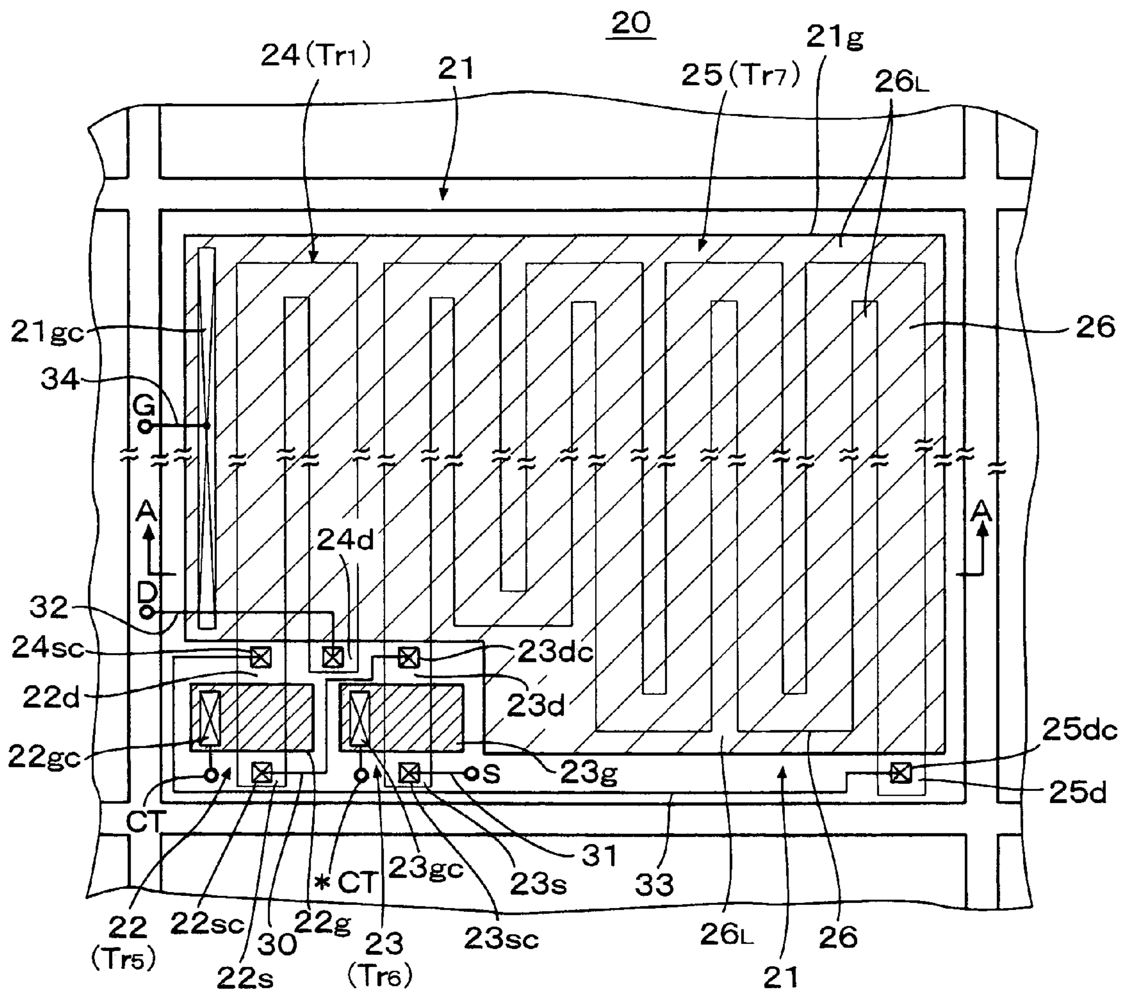
FIG. 3(*a*) is a plan view of an embodiment of the transistor cell circuit shown in FIG. 2.
Figure 3B:
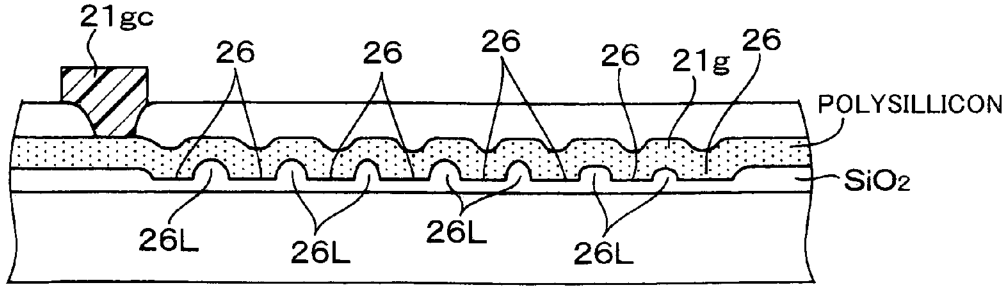

FIG. 3(*a*) shows a layout 20 of the cell circuit 1 including a series circuit of a transistor having a short channel length and a transistor having a long channel length, which are serpentine transistors.

Reference numeral 21 depicts a region including a region 24 in which the transistor Tr1 shown in FIG. 2 is formed and a region 25 in which the transistor Tr7 shown by a dotted line in FIG. 2 is formed. Channel length of the transistor Tr7 in the region 25 corresponds to a sum of the channel lengths of the transistors Tr2~Tr4 shown in FIG. 2. Therefore, in the embodiment 2, it is possible to reduce the number of transistors of the cell circuit 1 by two.

Reference numeral 22 depicts a region in which a transistor Tr5 constituting the switch circuit SW1 is formed and reference numeral 23 depicts a region in which a transistor Tr6 constituting the switch circuit SW2 is formed.

Reference numeral 24 depicts a region in which the transistor Tr1 is formed and includes a drain region 24*d* and a source contact region 24*sc*. A source region is provided below the drain and source contact regions 24*d* and 24*sc*. A striped U-shape channel region is provided between the source region and the drain region.

In the region 22 of the switch circuit SW1, reference numeral 22*s* depicts a source region of the transistor Tr5 and a source contact region 22*sc* thereof is connected to a drain contact region 23*dc* of a drain region 23*d* of the transistor Tr6, which is common with the source region of the transistor Tr7, through a wiring line 30 in an upper layer, so that the source region of the transistor Tr5 is connected to the source region of the transistor Tr7.

Reference numeral 22*g* depicts a gate region of the transistor Tr5. A gate contact region 22*gc* of the gate region 22*g* is connected to the terminal CT. A drain region 22*d* of the transistor Tr5 is commonly used as the source region of the transistor Tr1.

In the region 23 of the switch circuit SW2, reference numeral 23*s* depicts a source region of the transistor Tr6. A source contact region 23*sc* of the source region 23*s* is connected to the source terminal S through an upper wiring line 31. Reference numeral 23*g* depicts a gate region of the transistor Tr6 and a gate contact region 23*gc* of the gate region 23*g* is connected to the terminal *CT. A drain region 23*d* of the transistor Tr6 is used for the source region of the transistor Tr7.

The drain region 24*d* of the transistor Tr1 is connected to the drain terminal D through an upper layer wiring line 32. A source region of the transistor Tr1, which is common with the drain region of the transistor Tr7, is connected to a drain contact region 25*dc* of the drain region 25*d* of the transistor Tr7 through an upper layer wiring line 33. Thus, the transistor Tr5 (the switch circuit SW1) is connected in parallel to the transistor Tr7.

Reference numeral 21*g* depicts a gate region of the transistor cell TN (each of the transistor cells TNp and TNa~TNn−1) and reference numeral 25 depicts a gate contact region of the transistor cell TN. Reference numeral 26 depicts a channel forming region for forming a channel beneath the gate electrode in the gate region 21*g*, so that, when a predetermined voltage is applied to the gate, a folded and striped serpentine channel (inversion layer) is formed immediately below the channel forming region 26. A LOCOS (SiO2) region 26L for isolating respective strip channels is provided around the channel forming region.

FIG. 3(*b*) is a cross section taken along a line A—A in FIG. 3(*a*). The channel forming regions 26 and the LOCOS regions 26L are arranged alternately and a channel formed in the gate region is limited within the channel forming region 26. As a result, it is possible to form the striped serpentine channel in plan view in the gate region. Thus, a current flowing direction in the channel in the gate region become serpentine with which it is possible to reduce W/L of the transistor TN.

As a result, an equivalent circuit of the cell circuit 1 includes the series circuit of the transistor Tr1 having short gate length (short channel length L) and the transistor Tr7 having long gate length (long channel length L) and the switch circuits constructed with the respective transistors Tr5 and Tr6, as shown in FIG. 3(*a*). That is, in the cell circuit 1, the transistor Tr7 is provided instead of the transistors Tr2~Tr4 shown in FIG. 2.

(Embodiment 3)

Figure 4A:
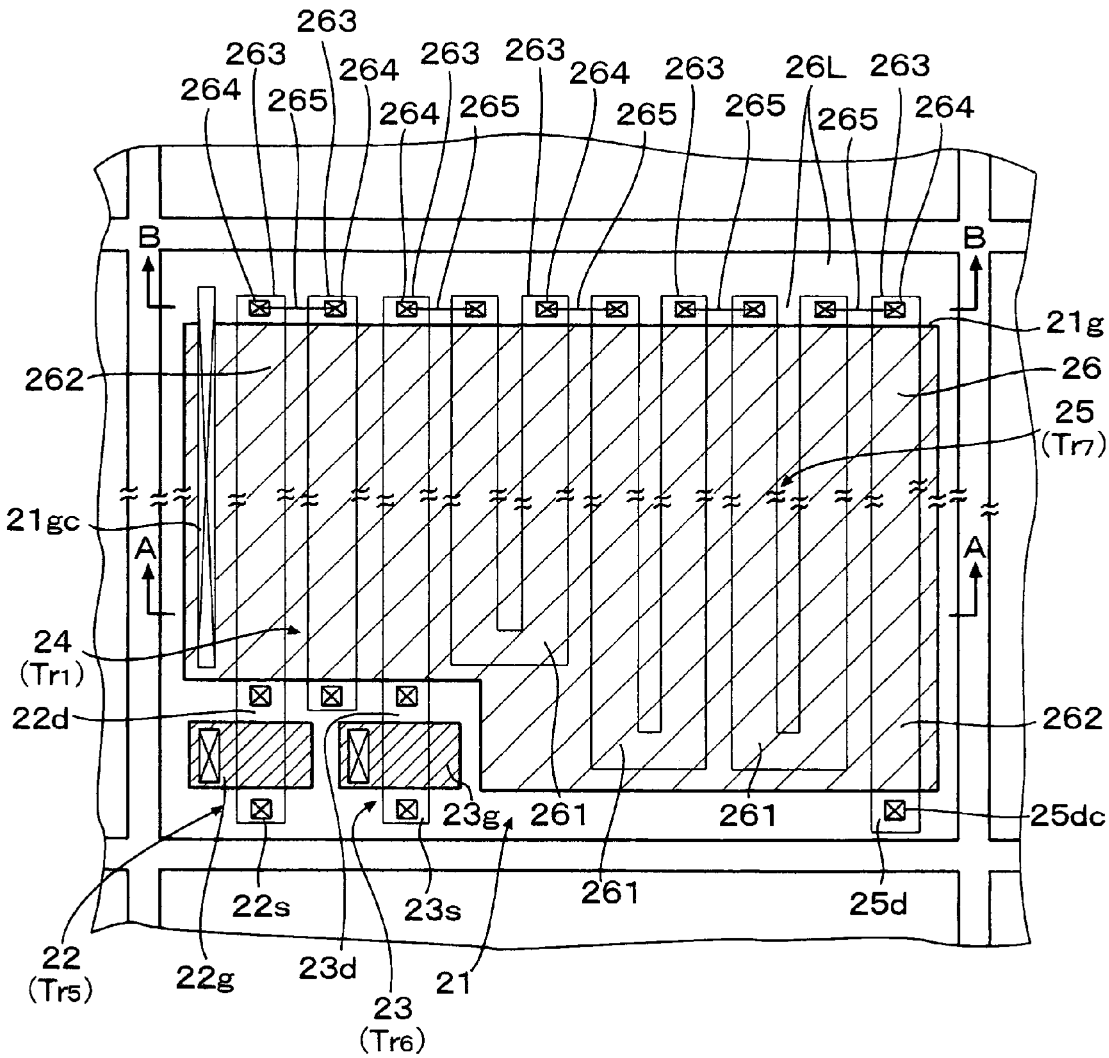
FIG. 4(*a*) is a plan view of another embodiment of the transistor cell circuit.
Figure 4B:
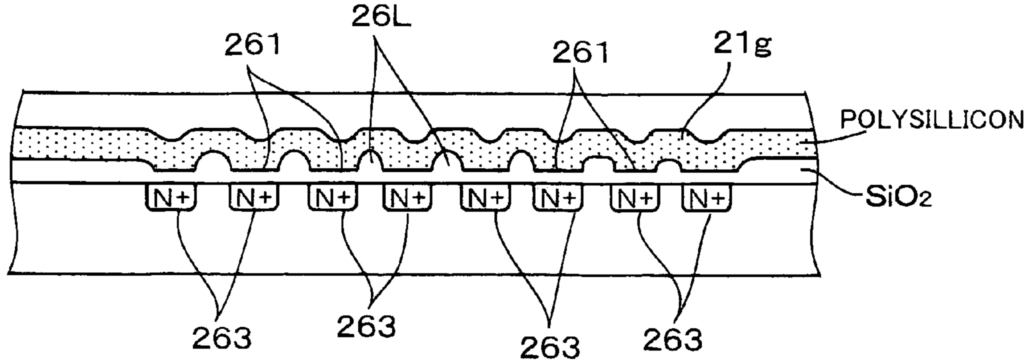

FIG. 4(*a*) shows another channel forming region 26, which includes a plurality of U-shaped serpentine channel forming regions 261 arranged in parallel and straight stripes 262 provided on both sides of the U-shaped serpentine channel forming regions 261. That is, the channel forming regions 261 correspond to the single channel forming region 26 shown in FIG. 3(*a*).

Outsides the gate region 21*g*, channel contact regions 263 having contact terminals 264 for deriving channel current are provided in end portions of the serpentine channel forming regions 261 and end portions of the stripes 262, respectively. The channel forming regions 261 and 262 are connected in series by connecting the contact terminals 264 thereof by wiring lines 265 in an upper wiring layer to form a single serpentine channel.

FIG. 4(*b*) is a cross section taken along a line A—A in FIG. 4(*a*), which is substantially the same as the cross section shown in FIG. 3(*b*). The channel contact regions 263 are formed immediately below the contact terminals of the serpentine channel forming regions 261 and the stripes 262, respectively, as N+1 and regions.

As described hereinbefore, the current source 12 of this embodiment is constructed with the single P channel MOS transistor having the source connected to the power source line +VDD and the drain connected to the input terminal 11*a*. In this case, a transistor for level regulation may be inserted into between the source of this transistor and the input terminal 11*a* correspondingly to the transistor TNv of the drive level shifter circuit 13*a*.

Further, due to the requirement of high precision D/A conversion, the input side transistor cells and the output side transistor cells are constructed with the identical cell circuits, respectively. However, the lowness of the power source line voltage provides a problem in the input transistor cells TNa and TNp of the current mirror circuit constituting the D/A converter circuit 11. Therefore, if high precision D/A conversion is not required, it is enough to provide the switch circuit SW1 or change the gate length in at least the input side transistor cell.

Further, although the N channel MOS transistors are used to construct the D/A converter circuit in the described embodiments, it is of course possible to construct the D/A converter circuit with P channel MOS transistors alone or a combination of P channel transistors and N channel transistors in this embodiment.

What is claimed is:

1. A D/A converter circuit for driving directly or indirectly an organic EL display panel, including a current mirror circuit constructed with an input side transistor circuit and an output side transistor circuit, said organic EL display panel being a self-emissive type display panel that uses organic materials formed into thin films and that is driven by electric current to generate light, said input side transistor circuit comprising:

a series circuit of a first MOS transistor and a second MOS transistor;

and a first switch circuit connected in parallel to said fist MOS transistor, gates of said first and second MOS transistors being connected commonly, a source of either one of said first and second MOS transistors being connected to a drain of the other of said first and second MOS transistors and said second MOS transistor having a gate length shorter than a gate length of said first MOS transistor, either one of a non-connected source and a non-connected drain of said first and second MOS transistors being connected to a power source line of a predetermined voltage, directly or indirectly, said first switch circuit being turned ON to supply a current larger than a current determined by a source-gate voltage between said gate and said non-connected source of one of said first and second MOS transistors, the source-gate voltage being limited by said predetermined voltage, to said series circuit to thereby obtain a large analog current at said output side transistor circuit of said current mirror circuit.

2. The D/A converter circuit as claimed in claim 1, wherein a plurality of said output side transistor circuits are provided, a voltage lower than the source-gate voltage limited by said predetermined voltage, is applied between said non-connected source of said the other MOS transistor and said gate and the analog current is obtained as a total of output currents of said output side transistor circuits.

3. The D/A converter circuit as claimed in claim 2, wherein each of said input side transistor circuit and said output transistor circuits is constructed with a transistor cell including said series circuit and a second switch circuit connected in series with said series circuit, said first switch circuits of said transistor cells are turned ON simultaneously and said second switch circuits of said transistor cells of said output side transistor circuits are ON/OFF controlled according to data to be D/A converted.

4. The D/A converter circuit as claimed in claim 3, wherein a plurality of said input side transistor circuits are provided in parallel, said second switch circuit of said transistor cell of one of said input side transistor circuits is turned ON to branch the large current to said transistor cells of said input side transistor circuits when said first switch circuit is turned OFF.

5. The D/A converter circuit as claimed in claim 4, wherein a peak current corresponding to the larger current is generated in the analog output current when said first switch circuits are turned ON.

6. The D/A converter circuit as claimed in claim 5, wherein said first MOS transistor is constructed with a plurality of transistors which are connected sequentially through a source-drain connection.

7. The D/A converter circuit as claimed in claim 5, wherein said first MOS transistor is a transistor having a folded stripe shaped serpentine gate region in plan view or a transistor having a channel, a current flowing direction in said channel being a folded stripe serpentine shape in plan view.

8. An organic EL drive circuit for driving an organic EL display panel, including a D/A converter circuit constructed with a current mirror circuit, which has an input side transistor circuit and an output transistor circuit and generates an analog current in response to a display data, for generating a drive current of an organic EL element or a current on which the drive current is obtained, said organic EL display panel being a self-emissive type display panel that uses organic materials formed into thin films and that is driven by electric current to generate light, said current mirror circuit comprising;

said input side transistor circuit comprising:

a series circuit of a first MOS transistor and a second MOS transistor; and

- a first switch circuit connected in parallel to said first MOS transistor,
- gates of said first and second MOS transistors being connected commonly,
- a source of either one of said first and second MOS transistors being connected to a drain of the other of said first and second MOS transistors and said second MOS transistor having a gate length shorter than a gate length of said first MOS transistor,
- either one of a non-connected source and a non-connected drain of said first and second MOS transistors being connected to a power source line of a predetermined voltage, directly or indirectly,
- said first switch circuit being turned ON to supply a current larger than a current determined by a source-gate voltage between said gate and said non-connected source of one of said first and second MOS transistors, the source-gate voltage being limited by said predetermined voltage, to said series circuit to thereby obtain a large analog current at said output side transistor circuit of said current mirror circuit.

9. The organic EL drive circuit as claimed in claim 8, further comprising:

- a current source for current-driving said organic EL element by an output current of said D/A converter circuit, wherein a plurality of said output side transistor circuits are provided, a voltage lower than the source-gate voltage limited by said predetermined voltage, is applied between said non-connected source of said the other MOS transistor and said gate and the analog current is obtained as a total of output currents of said output side transistor circuits.

10. The organic EL drive circuit as claimed in claim 9, wherein each of said input side transistor circuit and said output transistor circuits is constructed with a transistor cell including said series circuit and a second switch circuit connected in series with said series circuit, said first switch circuits of said transistor cells are turned ON simultaneously and said second switch circuits of said transistor cells of said output side transistor circuits are ON/OFF controlled according to data to be D/A converted.

11. The organic EL drive circuit as claimed in claim 10, wherein a plurality of said input side transistor circuits are provided in parallel, said second switch circuit of said transistor cell of one of said input side transistor circuits is turned ON to branch the large current to said transistor cells of said input side transistor circuits when said first switch circuit is turned OFF.

12. An organic EL display device having a drive circuit including a D/A converter circuit constructed with a current mirror circuit, which has an input side transistor circuit and an output transistor circuit and generates an analog current in response to a display data, for generating a drive current of an organic EL element or a current on which the drive current is obtained, for outputting a drive current of an organic EL element to a terminal pin of an organic EL panel, said organic EL display device being a self-emissive type display that uses organic materials formed into thin films and that is driven by electric current to generate light, said current mirror circuit comprising:

- a series circuit of a first MOS transistor and a second MOS transistor; and
- a first switch circuit connected in parallel to said first MOS transistor,
- gates of said first and second MOS transistors being connected commonly,
- a source of either one of said first and second MOS transistors being connected to a drain of the other of said first and second MOS transistors and said second MOS transistor having a gate length shorter than a gate length of said first MOS transistor,
- either one of a non-connected source and a non-connected drain of said first and second MOS transistors being connected to a power source line of a predetermined voltage, directly or indirectly,
- said first switch circuit being turned ON to supply a current larger than a current determined by a source-gate voltage between said gate and said non-connected source of one of said first and second MOS transistors, the source-gate voltage being limited by said predetermined voltage, to said series circuit to thereby obtain a large analog current at said output side transistor circuit of said current mirror circuit.

13. The organic EL display device as claimed in claim 12, further comprising a current source for current-driving said organic EL element by an output current of said D/A converter circuit, wherein a plurality of said output side transistor circuits are provided, a voltage lower than the source-gate voltage limited by said predetermined voltage, is applied between said non-connected source of said the other MOS transistor and said gate and the analog current is obtained as a total of output currents of said output side transistor circuits.

14. The organic EL display device as claimed in claim 13, wherein each of said input side transistor circuit and said output transistor circuits is constructed with a transistor cell including said series circuit and a second switch circuit connected in series with said series circuit, said first switch circuits of said transistor cells are turned ON simultaneously and said second switch circuits of said transistor cells of said output side transistor circuits are ON/OFF controlled according to data to be D/A converted.

15. The organic EL display device as claimed in claim 14, wherein said D/A converter circuit and said current source are provided for each said terminal pin, a plurality of said input side transistor circuits are provided in parallel, said second switch circuit of said transistor cell of either one of said input side transistor circuits is turned ON to branch the large current to said transistor cells of said input side transistor circuits when said first switch circuit is turned OFF.

* * * * *